United States Patent
Miyazaki et al.

(10) Patent No.: US 11,894,244 B2
(45) Date of Patent: Feb. 6, 2024

(54) CLEANING MEMBER MOUNTING MECHANISM AND SUBSTRATE CLEANING APPARATUS

(71) Applicant: EBARA CORPORATION, Tokyo (JP)

(72) Inventors: Mitsuru Miyazaki, Tokyo (JP); Tomoaki Fujimoto, Tokyo (JP); Takuya Inoue, Tokyo (JP)

(73) Assignee: EBARA CORPORATION, Tokyo (JP)

(*) Notice: Subject to any disclaimer, the term of this patent is extended or adjusted under 35 U.S.C. 154(b) by 174 days.

(21) Appl. No.: 17/336,627

(22) Filed: Jun. 2, 2021

(65) Prior Publication Data

US 2021/0384048 A1 Dec. 9, 2021

(30) Foreign Application Priority Data

Jun. 3, 2020 (JP) ................. 2020-097110

(51) Int. Cl.
*H01L 21/67* (2006.01)
*B08B 1/00* (2006.01)
*B08B 1/02* (2006.01)

(52) U.S. Cl.
CPC ........ *H01L 21/67046* (2013.01); *B08B 1/002* (2013.01); *B08B 1/02* (2013.01)

(58) Field of Classification Search
CPC ......... H01L 21/67046; H01L 21/02041; H01L 21/02043; H01L 21/02052; H01L 21/02057; H01L 21/0206; H01L 21/02063; H01L 21/02065; H01L 21/02068; H01L 21/02071; H01L 21/02074; H01L 21/02076; H01L 21/02079; H01L 21/02083; H01L 21/02085; H01L 21/02087; H01L 21/6708; B08B 1/002; B08B 1/02; B08B 1/04; B08B 13/00
USPC ........ 15/88, 77, 88.2, 88.3, 103.5, 102, 88.4
See application file for complete search history.

(56) References Cited

U.S. PATENT DOCUMENTS 6,248,009 B1* 6/2001 Ito .................... B08B 1/007
451/443
2020/0188962 A1* 6/2020 Uozumi ............ B08B 3/04

FOREIGN PATENT DOCUMENTS

JP 2000-301079 A 10/2000

* cited by examiner

*Primary Examiner* — Tom Rodgers
*Assistant Examiner* — Abbie E Quann
(74) *Attorney, Agent, or Firm* — BakerHostetler

(57) ABSTRACT

A cleaning member mounting mechanism has: a cleaning member holding part, to which a cleaning member assembly having a cleaning member for cleaning a substrate W can be mounted; a member rotation part for rotating the cleaning member assembly held by the cleaning member holding part; and a moving part which moves the cleaning member holding part along an axial direction when the cleaning member assembly is removed, thereby to bring the cleaning member holding part into a rotation fixed position to restrict a rotation of the cleaning member holding part.

8 Claims, 18 Drawing Sheets

[FIG. 1]
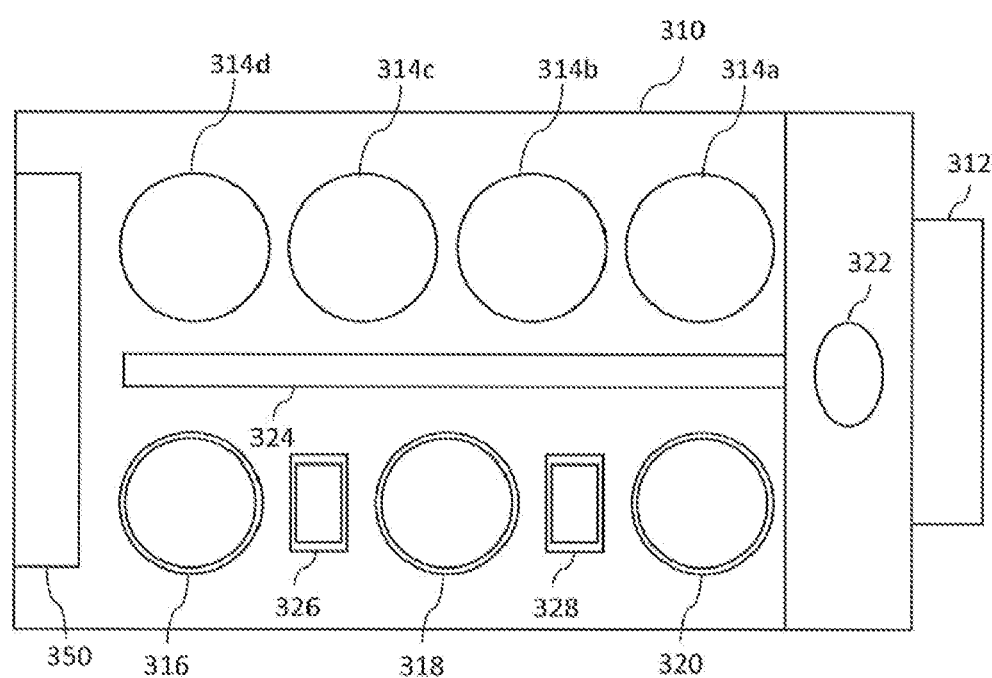

[FIG. 2]
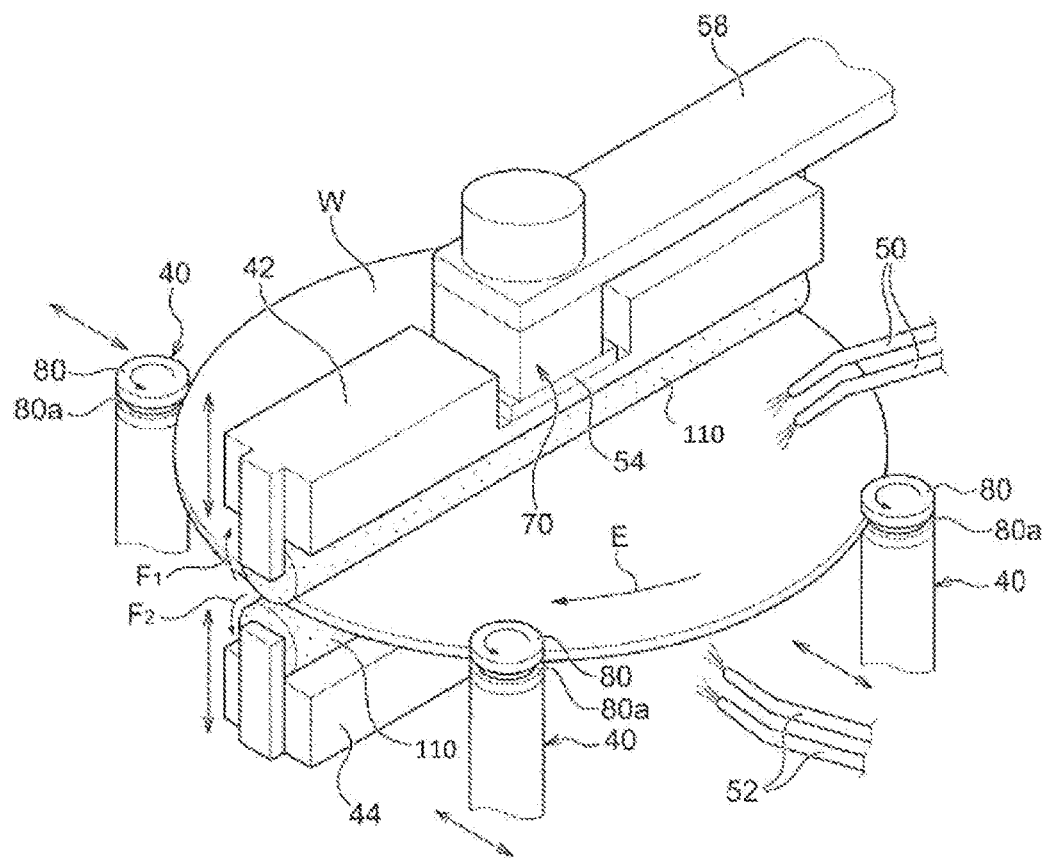

[FIG. 3]
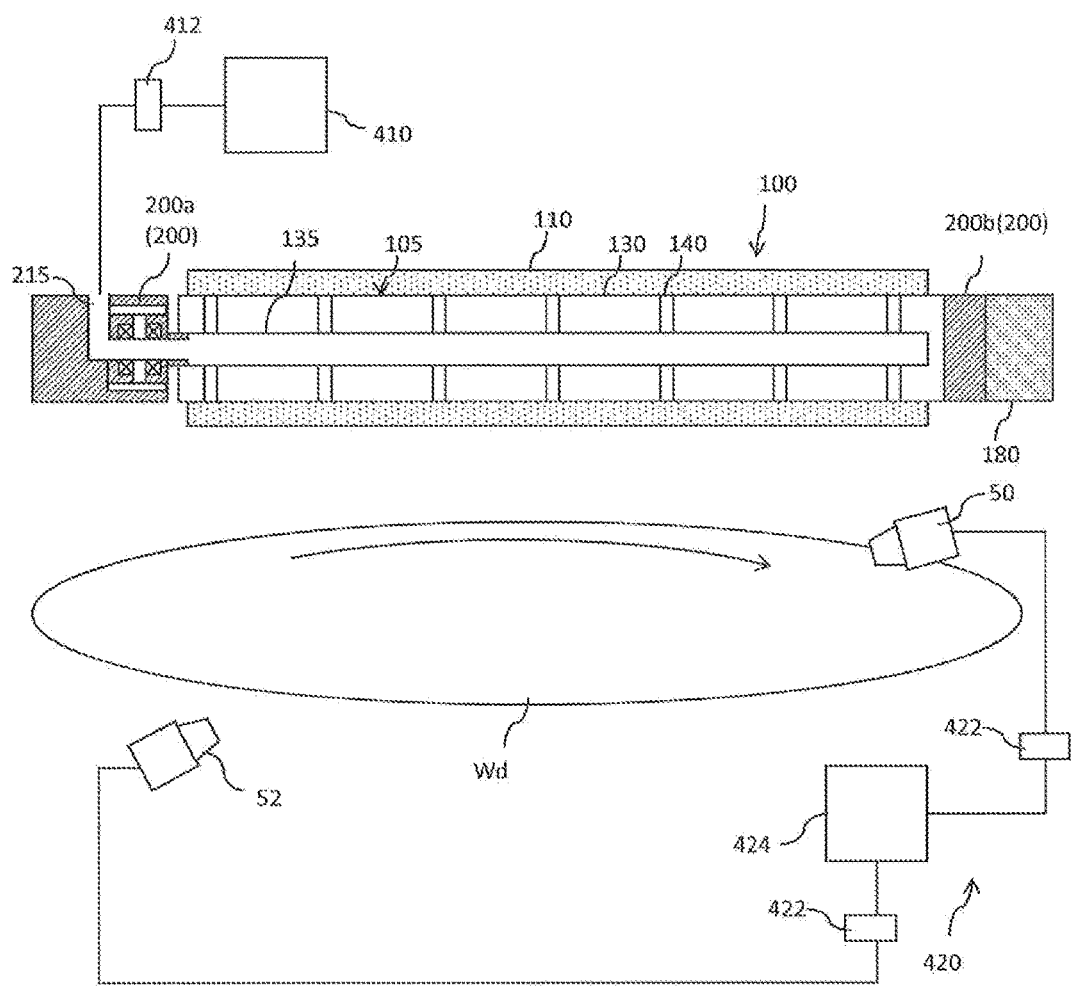

[FIG. 4]
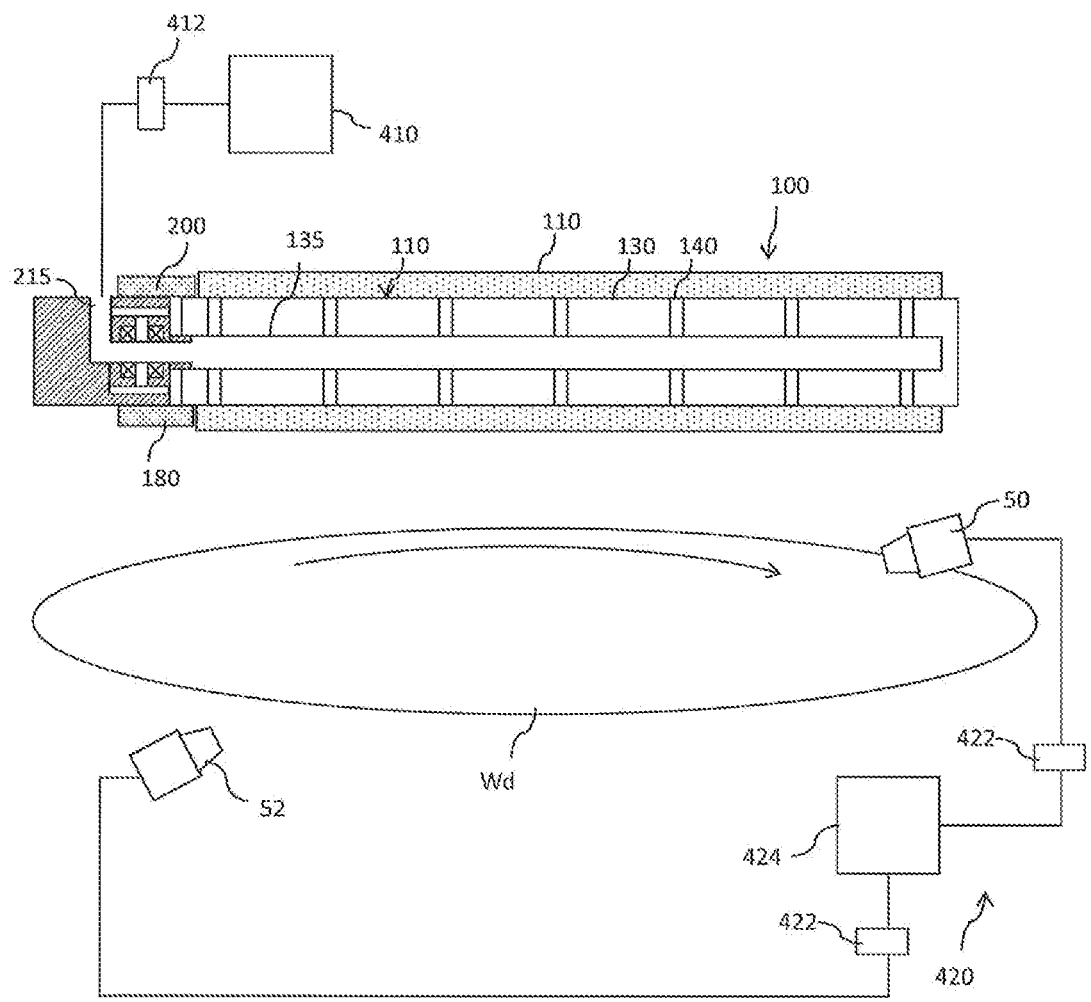

[FIG. 5]
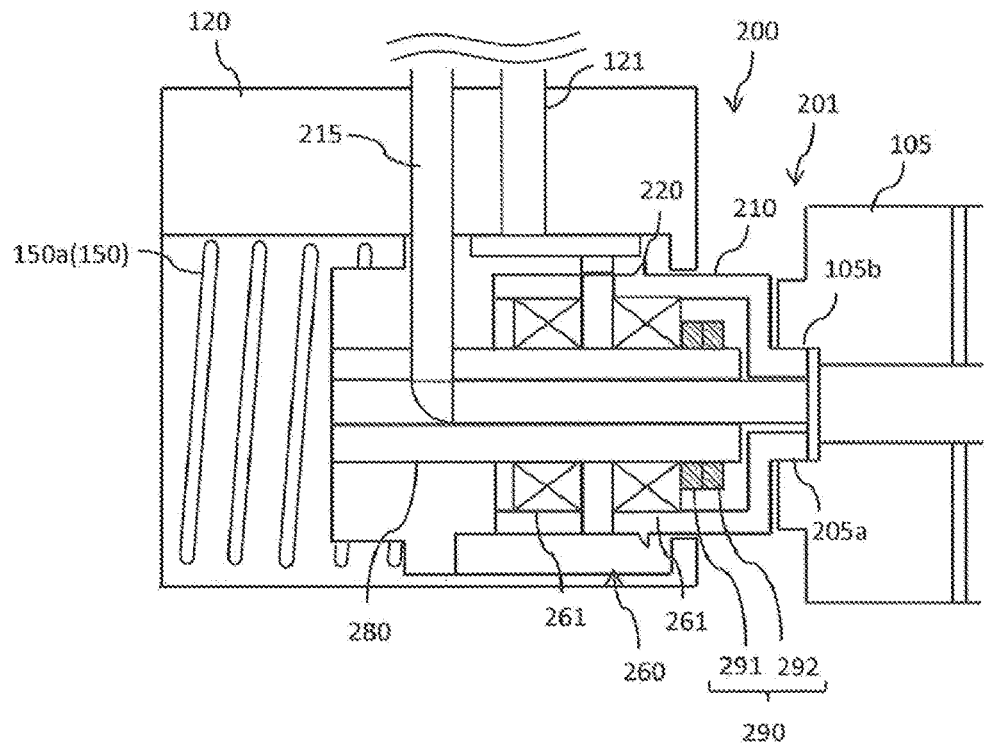
[FIG. 6]
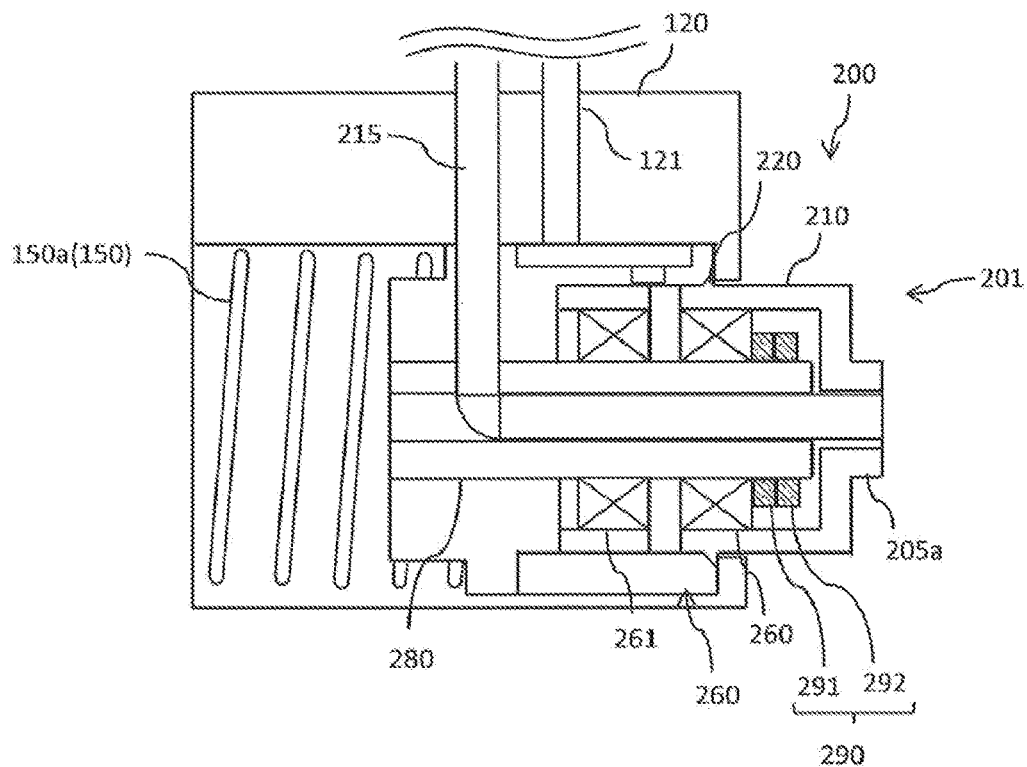

[FIG. 7]
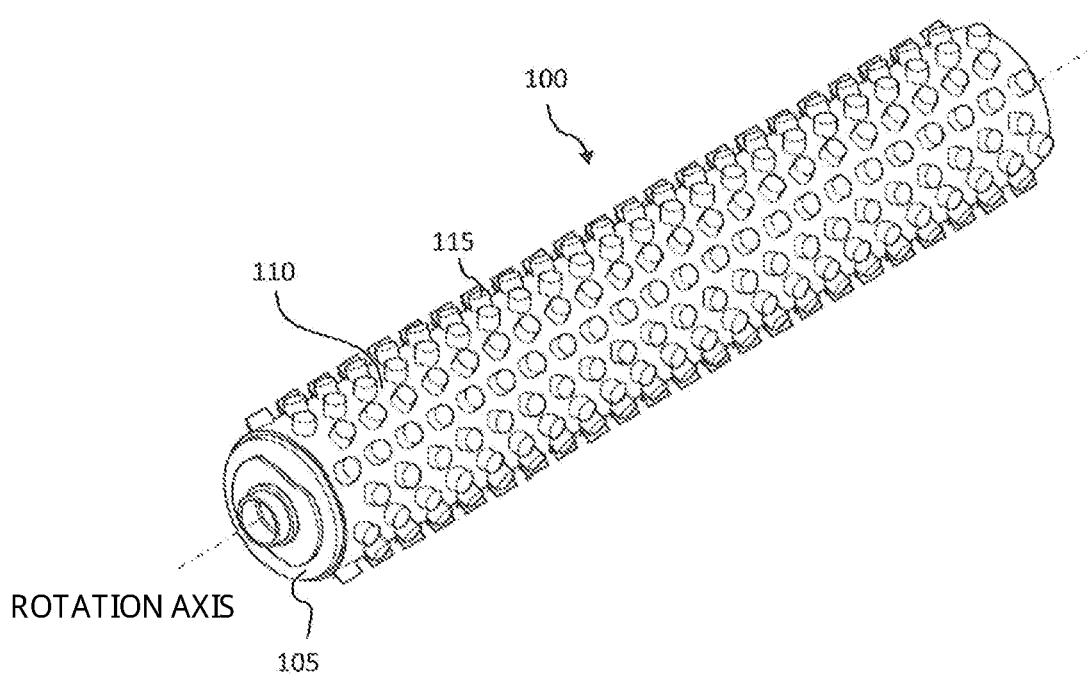

[FIG. 8]
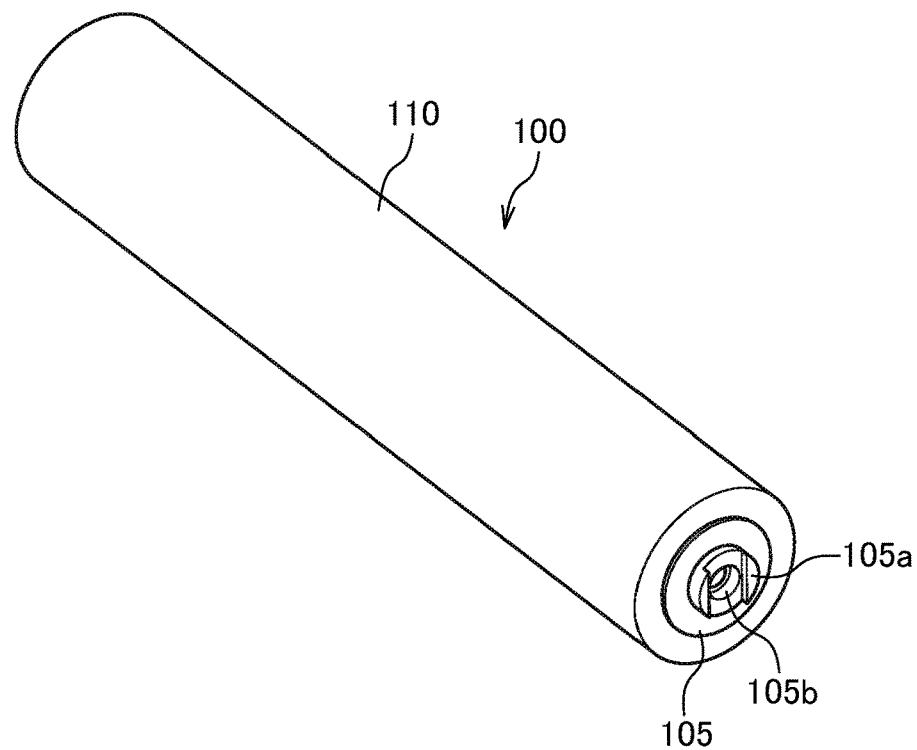
[FIG. 9]
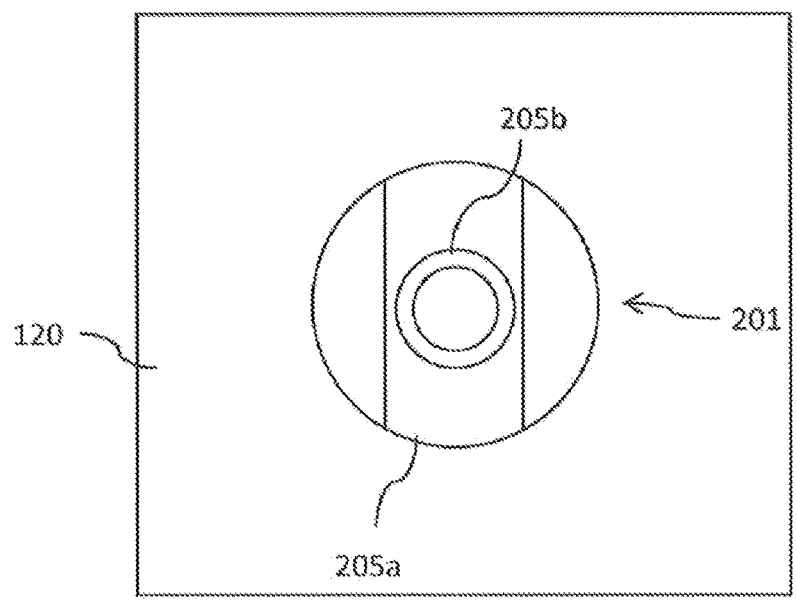

[FIG. 10]
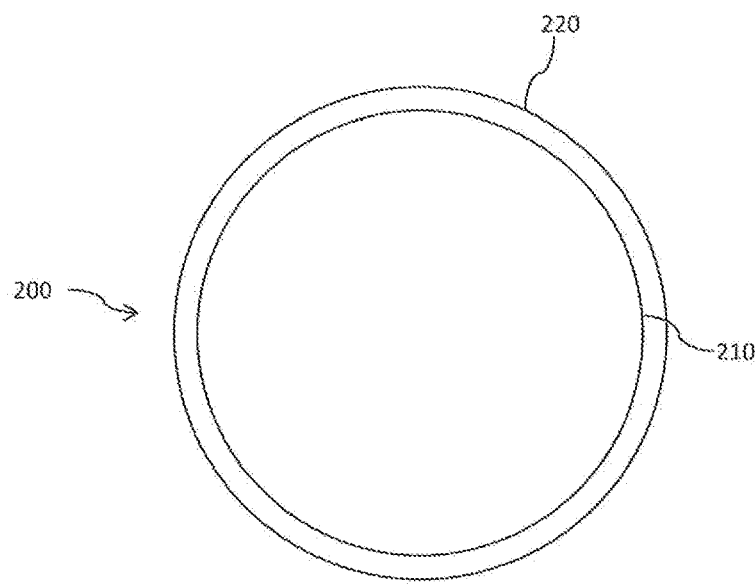
[FIG. 11]
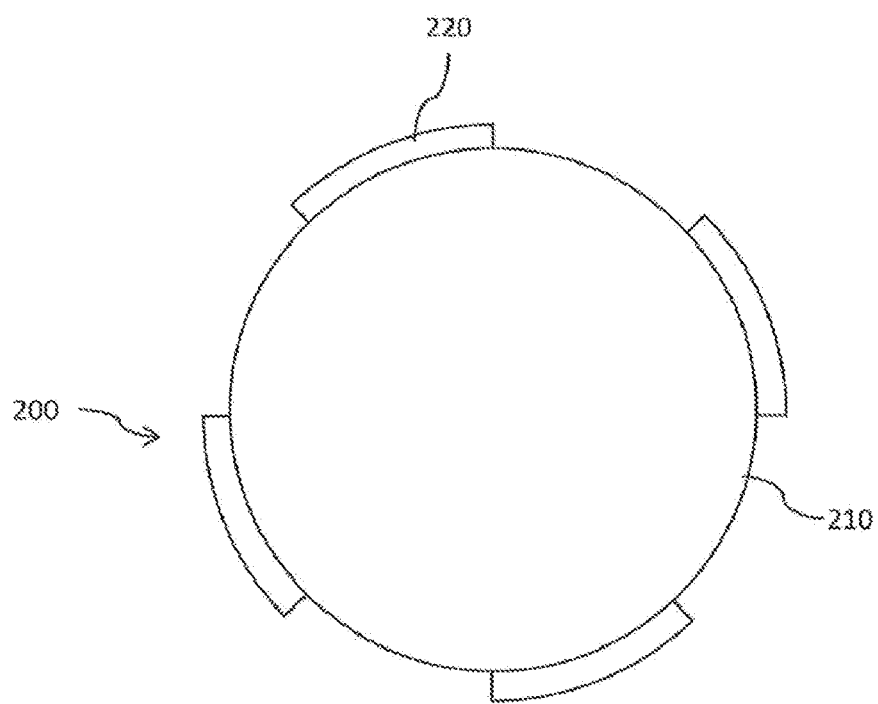

[FIG. 12]
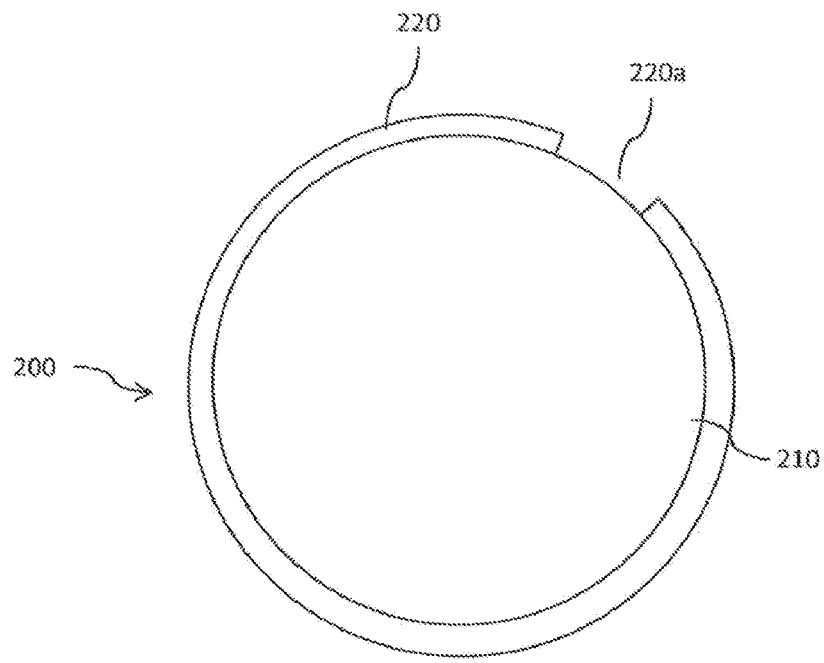
[FIG. 13]
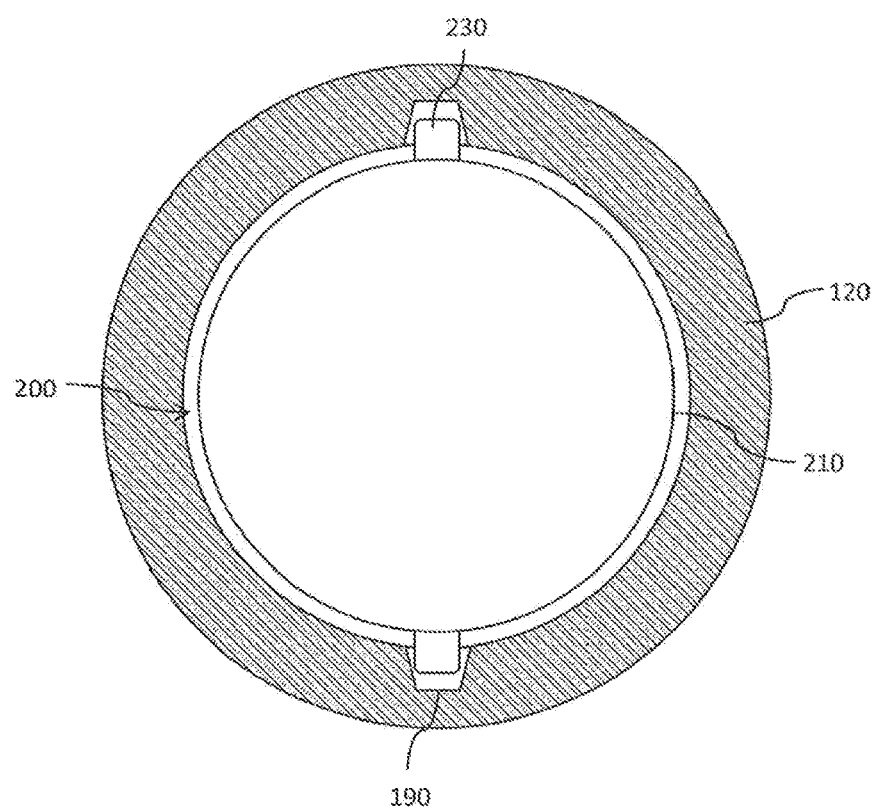

[FIG. 14]
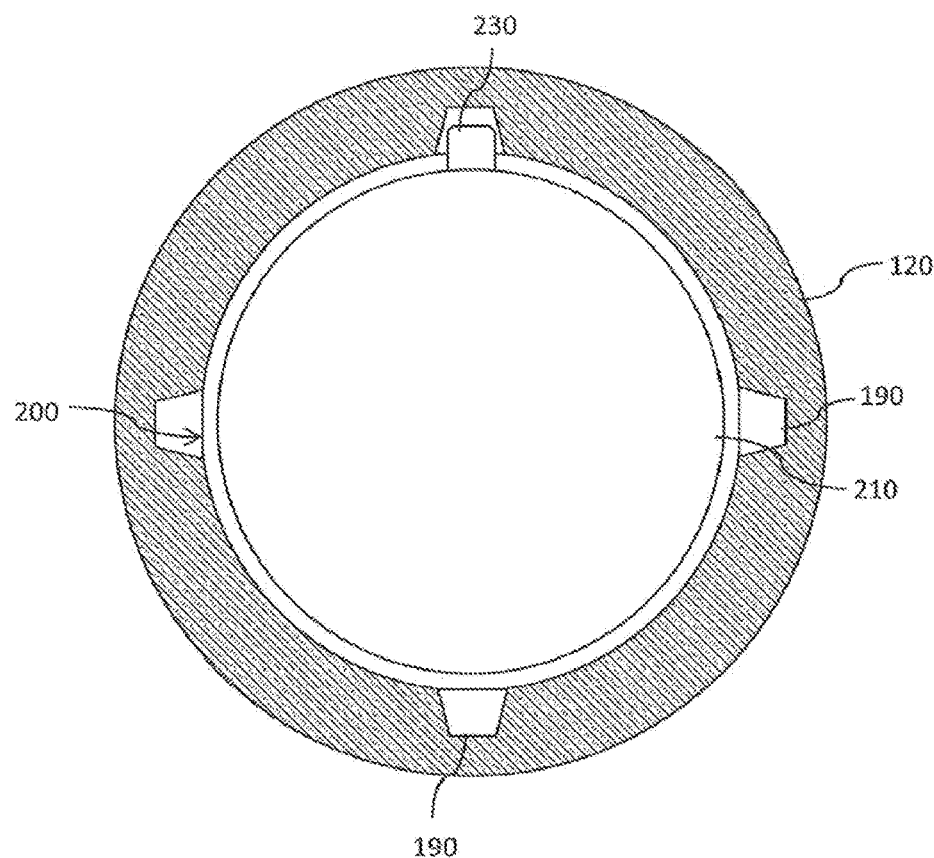
[FIG. 15]
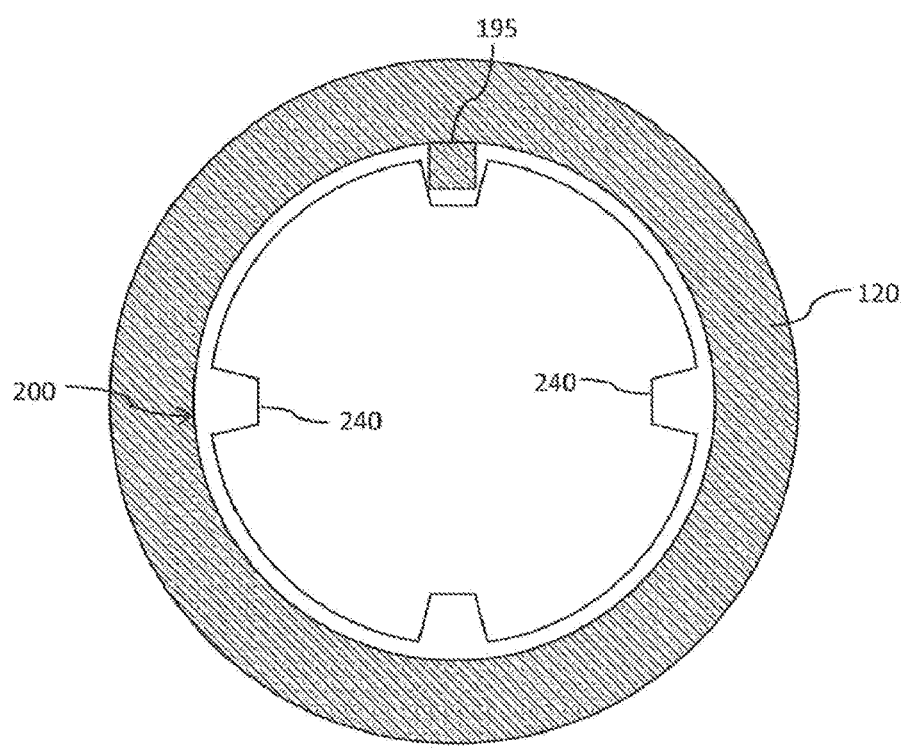

[FIG. 16]
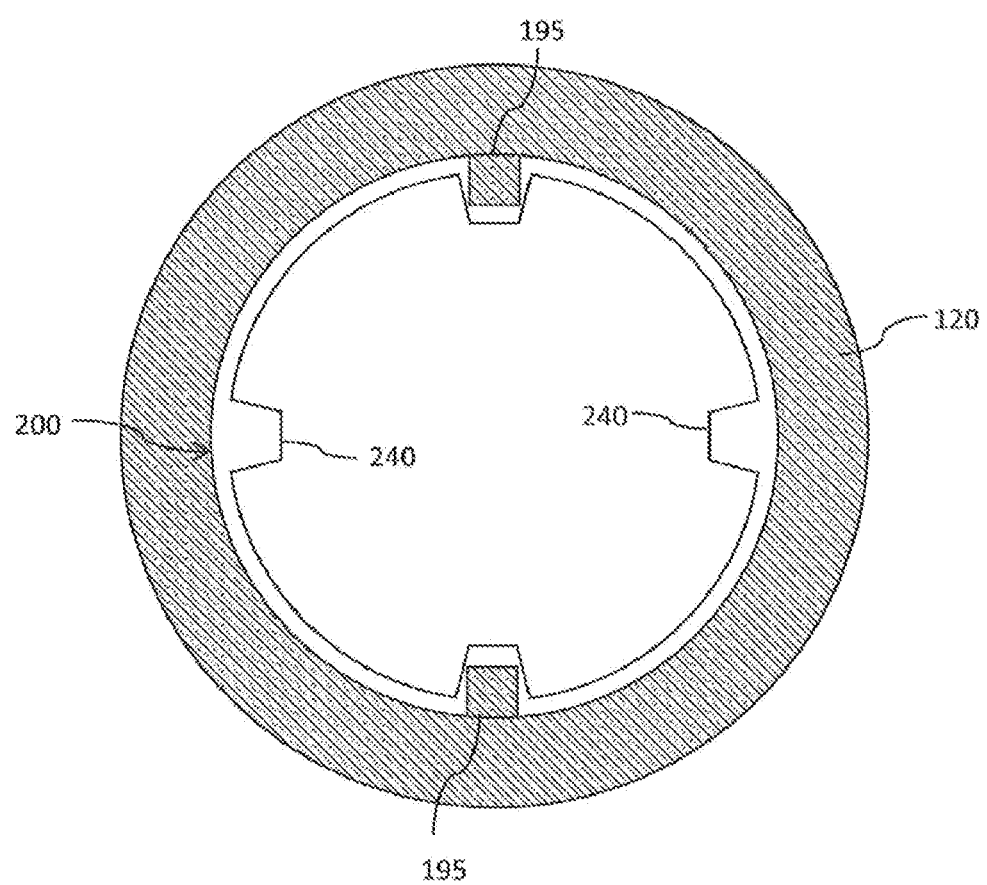

[FIG. 17]
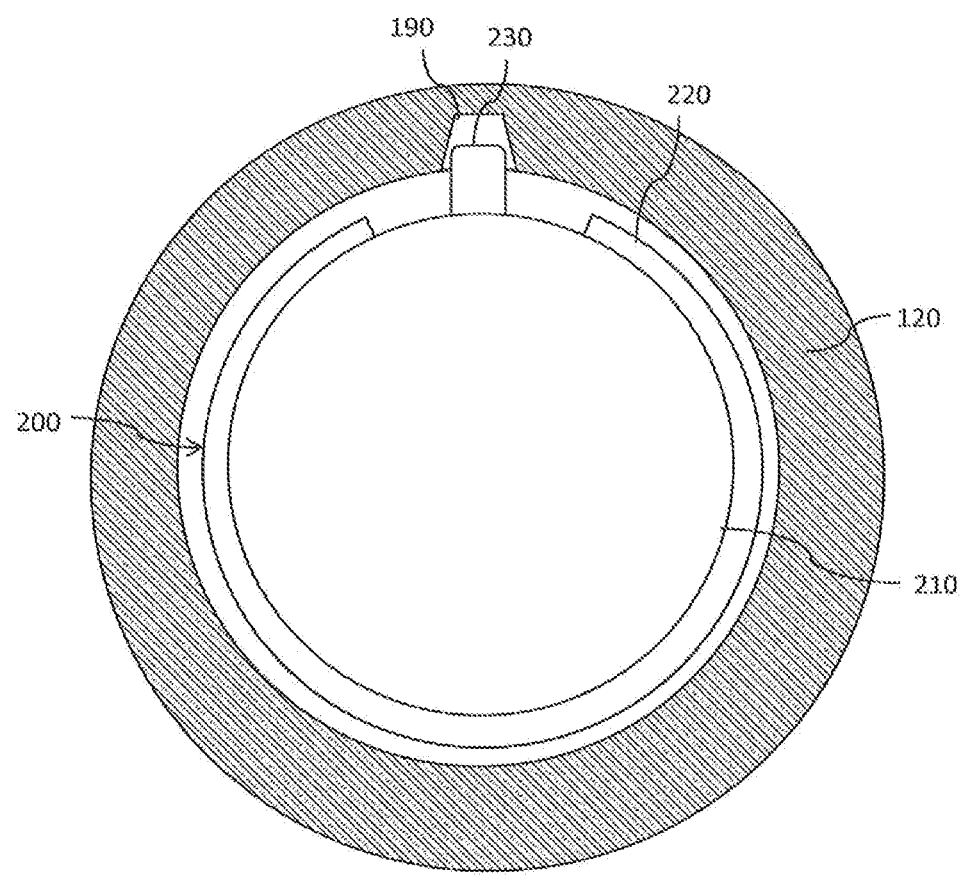

[FIG. 18]
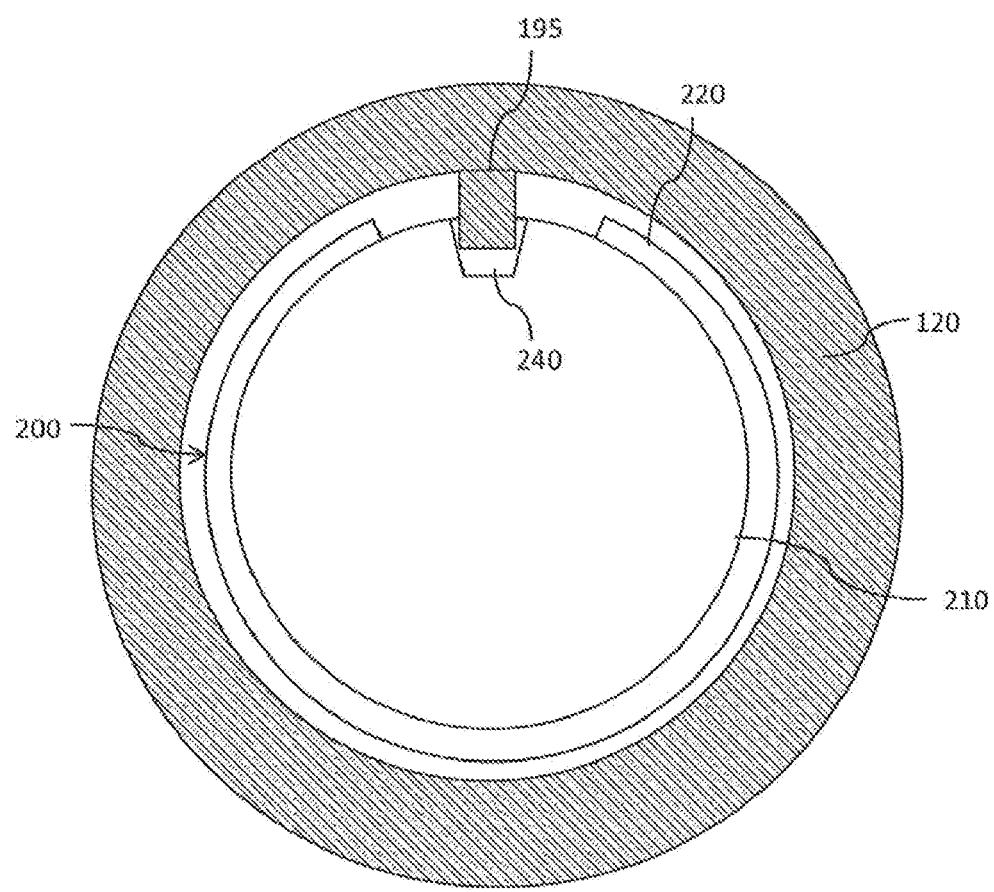

[FIG. 19A]
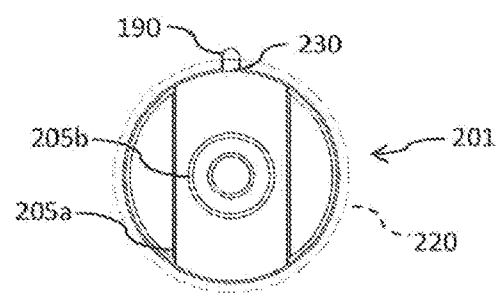
[FIG. 19B]
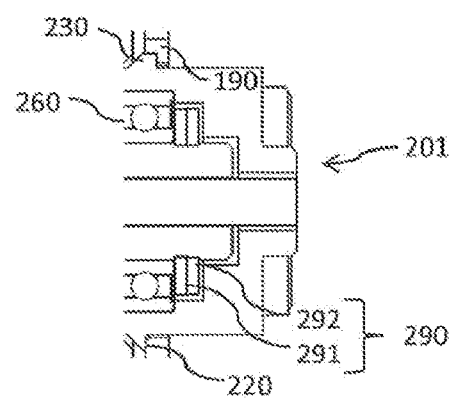
[FIG. 20A]
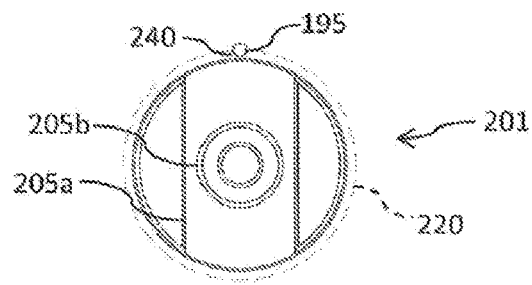
[FIG. 20B]
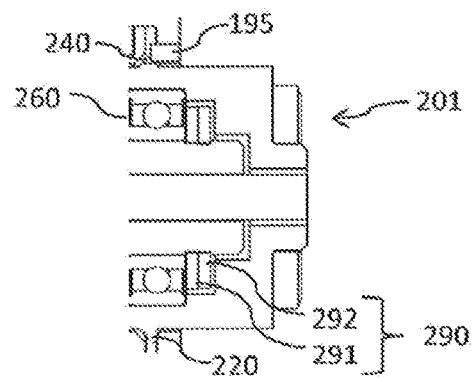

[FIG. 21A]
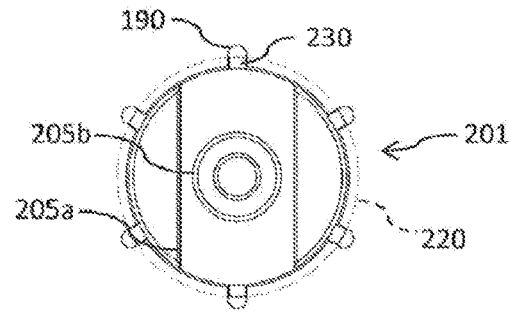
[FIG. 21B]
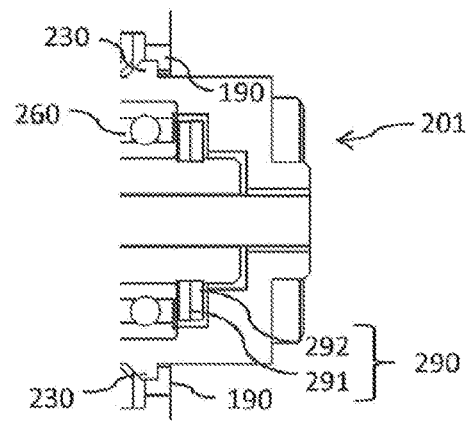
[FIG. 22A]
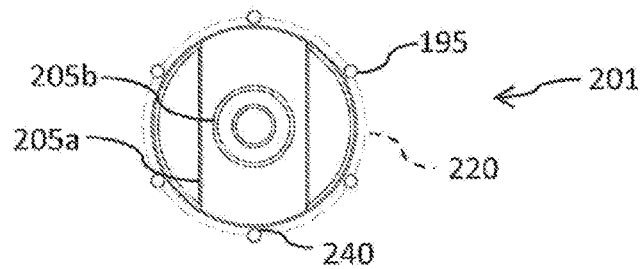
[FIG. 22B]
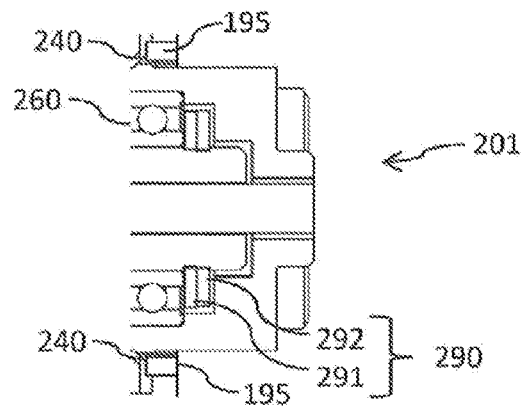

[FIG. 23A]
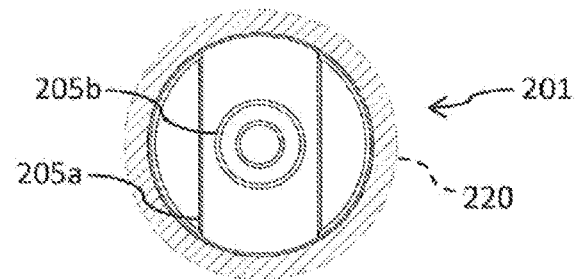
[FIG. 23B]
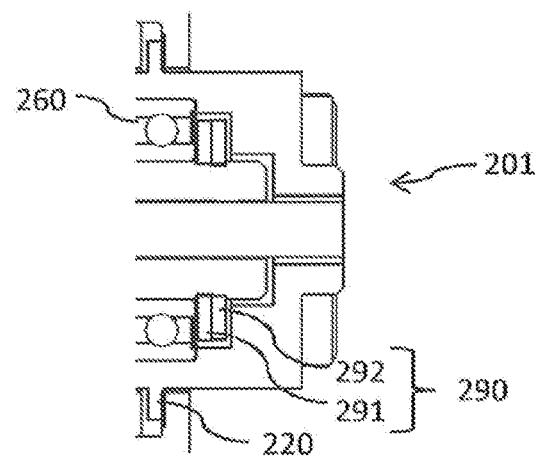
[FIG. 24]
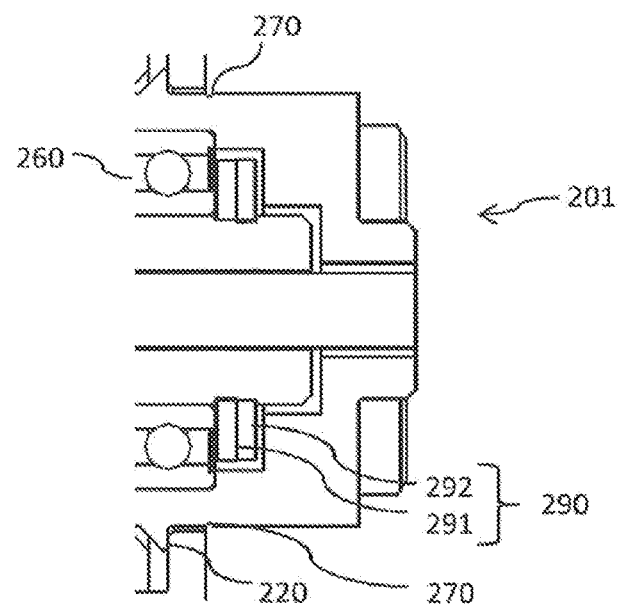

[FIG. 25A]
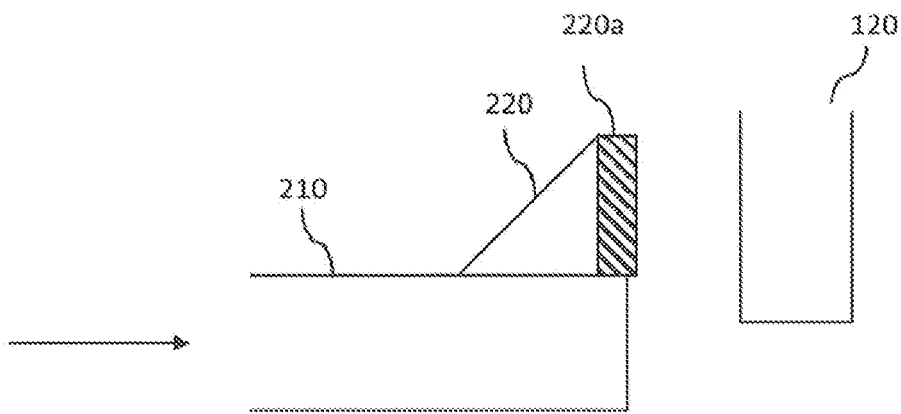
[FIG. 25B]
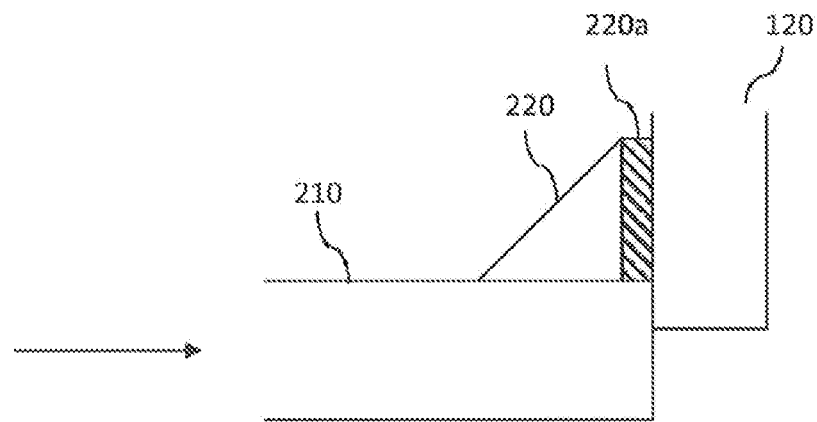

[FIG. 26]
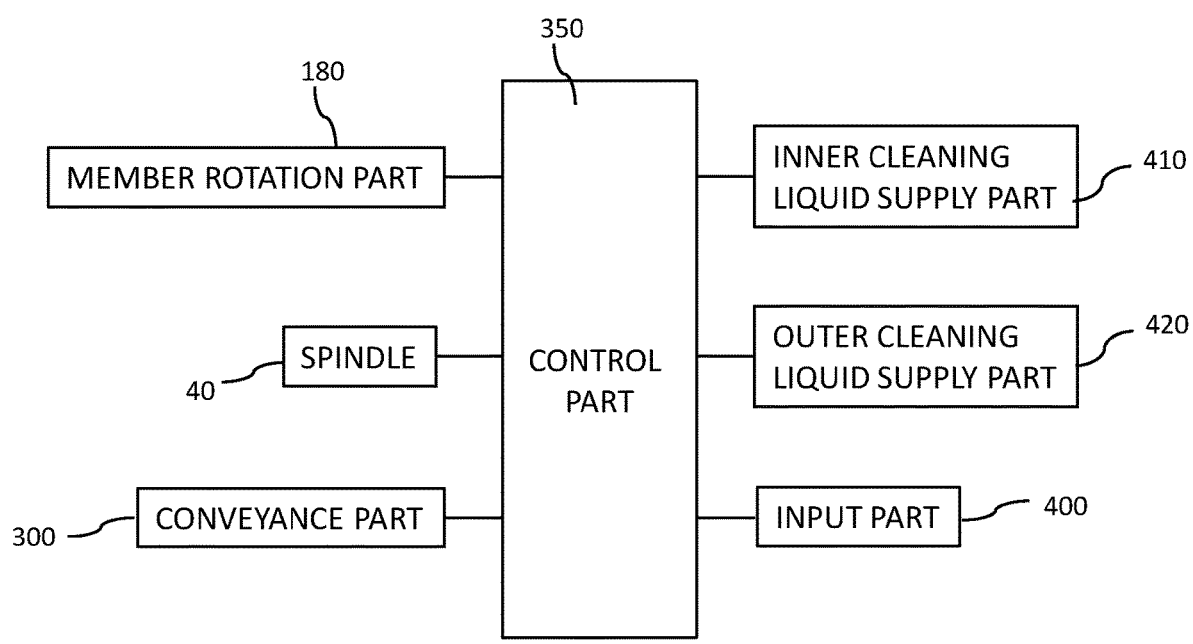

CLEANING MEMBER MOUNTING MECHANISM AND SUBSTRATE CLEANING APPARATUS

TECHNICAL FIELD

The present invention relates to a cleaning member mounting mechanism to which a cleaning member assembly is mountable and that has a cleaning member holding part rotatable with the cleaning member assembly mounted, and a substrate cleaning apparatus.

The present application claims the priority of Japanese Patent Application No. 2020-097110 filed on Jun. 3, 2020, the contents of which are entirely incorporated by reference.

BACKGROUND ART

Conventionally, there has been known, as a method of cleaning a substrate such as a polished wafer with a high degree of cleaning, that the substrate is subjected to scrub cleaning (primary cleaning) by which to rub the cleaning surface of the substrate with a cleaning member made of a brush or sponge, and then the substrate is subjected to finish cleaning (secondary cleaning) by which to spray the substrate with high-pressure water (high-speed jet flow) and clean the substrate with air bubbles generated by cavitation.

As the cleaning member, for example, a roll cleaning member and a pencil cleaning member are known. As an example, JP 2000-301079 A discloses a substrate cleaning apparatus that has a substrate holding part that holds a substrate while rotating the substrate in an almost horizontal plane, a cleaning tool that scrubs the surface to be cleaned of the substrate, and a cleaning tool holding part that holds the cleaning tool rotatably around its axis. Cleaning members such as roll cleaning members and pencil cleaning members are appropriately cleaned and used, but they are also replaced at regular intervals. When replacing the cleaning member, a cleaning member assembly including a new cleaning member is mounted to the cleaning member holding part. However, since the cleaning member holding part is rotatable, the mounting work may take time and effort.

SUMMARY OF INVENTION

Problem to be Solved by Invention

The present invention has been made in view of these points, and provides a cleaning member mounting mechanism that allows a cleaning member assembly to be easily mounted to a cleaning member holding part, and a substrate cleaning apparatus.

Means for Solving Problem

[Concept 1]
  A cleaning member mounting mechanism may comprise:
  a cleaning member holding part, to which a cleaning member assembly having a cleaning member for cleaning a substrate can be mounted;
  a member rotation part for rotating the cleaning member assembly held by the cleaning member holding part; and
  a moving part which moves the cleaning member holding part along an axial direction when the cleaning member assembly is removed, thereby to bring the cleaning member holding part into a rotation fixed position to restrict a rotation of the cleaning member holding part.

[Concept 2]
  In the cleaning member mounting mechanism according to concept 1,
  the moving part may be an elastic member.

[Concept 3]
  In the cleaning member mounting mechanism according to concept 1 or 2,
  the cleaning member holding part may have a second cleaning member holding part provided on a member rotation part side and rotated by the member rotation part, and a first cleaning member holding part rotated passively, and
  the moving part may be provided in the first cleaning member holding part.

[Concept 4]
  In the cleaning member mounting mechanism according to any one of concepts 1 to 3,
  the cleaning member holding part may have a peripheral edge protruding part which protrudes peripherally outward, and
  the rotation of the cleaning member holding part may be restricted by the peripheral edge protruding part coming into surface contact with an inner surface of a housing part housing at least a part of the cleaning member holding part and being pressed against the inner surface of the housing part.

[Concept 5]
  In the cleaning member mounting mechanism according to concept 4,
  the peripheral edge protruding part may have one or more grooves.

[Concept 6]
  In the cleaning member mounting mechanism according to concept 4 or 5,
  in a vertical cross section, the peripheral edge protruding part may be thicker on a cleaning member side than on a side opposite to the cleaning member.

[Concept 7]
  In the cleaning member mounting mechanism according to any one of concepts 1 to 6,
  the cleaning member holding part may have a first protruding part protruding peripherally outward, and a housing part housing at least a part of the cleaning member holding part may have a first concave part housing the first protruding part on an inner surface, or
  a housing part housing at least a part of the cleaning member holding part may have a second protruding part on an inner surface, and the cleaning member holding part may have a second concave part which houses the second protruding part.

[Concept 8]
  In the cleaning member mounting mechanism according to concept 7,
  a plurality of first concave parts may be provided when the first protruding part is provided, or a plurality of second concave parts are provided when the second protruding part may be provided.

[Concept 9]
  A substrate cleaning apparatus may comprise:
  a substrate support part for supporting a substrate;
  a cleaning member holding part, to which a cleaning member assembly having a cleaning member for cleaning the substrate can be mounted;
  a member rotation part for rotating the cleaning member assembly held by the cleaning member holding part; and a moving part which moves the cleaning member holding part along an axial direction when the cleaning member assembly is removed, thereby to bring the cleaning member holding part into a rotation fixed position to restrict a rotation of the cleaning member holding part.

According to the present invention, a cleaning member assembly is easily mounted to a cleaning member holding part.

BRIEF DESCRIPTION OF DRAWINGS

FIG. 1 is a schematic plan view showing the overall configuration of a substrate processing apparatus according to an embodiment of the present invention;

FIG. 2 is a perspective view of a substrate cleaning apparatus that can be used in the embodiment of the present invention;

FIG. 3 is a schematic diagram showing a substrate cleaning apparatus used as an example of the embodiment of the present invention;

FIG. 4 is a schematic diagram showing a substrate cleaning apparatus used as another example of the embodiment of the present invention;

FIG. 5 is a side sectional view of a structure in which a cleaning member assembly is mounted to a cleaning member holding part that can be used in the embodiment of the present invention;

FIG. 6 is a side sectional view of a structure in which the cleaning member assembly is removed from the cleaning member holding part that can be used in the embodiment of the present invention;

FIG. 7 is a perspective view of an example of a roll cleaning member that can be used in the embodiment of the present invention;

FIG. 8 is a perspective view of another example of a roll cleaning member that can be used in the embodiment of the present invention;

FIG. 9 is a diagram showing an aspect of the cleaning member holding part that can be used in the embodiment of the present invention, which is viewed along a rotation axis of the cleaning member assembly;

FIG. 10 is a diagram showing an aspect of a first example of the cleaning member holding part with a peripheral edge protruding part that can be used in the embodiment of the present invention, which is viewed along the rotation axis of the cleaning member assembly;

FIG. 11 is a diagram showing an aspect of a second example of the cleaning member holding part with a peripheral edge protruding part that can be used in the embodiment of the present invention, which is viewed along the rotation axis of the cleaning member assembly;

FIG. 12 is a diagram showing an aspect of a third example of the cleaning member holding part with a peripheral edge protruding part that can be used in the embodiment of the present invention, which is viewed along the rotation axis of the cleaning member assembly;

FIG. 13 is a diagram showing a first example of an aspect of a cleaning member holding part having a first protruding part and a housing part having a first concave part for housing the first protruding part that can be used in the embodiment of the present invention and are viewed along the rotation axis of the cleaning member assembly;

FIG. 14 is a diagram showing a second example of an aspect of a cleaning member holding part having a first protruding part and a housing part having a first concave part for housing the first protruding part that can be used in the embodiment of the present invention, which are viewed along the rotation axis of the cleaning member assembly;

FIG. 15 is a diagram showing a first example of an aspect of a housing part having a second protruding part and a cleaning member holding part having a second concave part for housing the second protruding part that can be used in the embodiment of the present invention, which are viewed along the rotation axis of the cleaning member assembly;

FIG. 16 is a diagram showing a second example of an aspect of a housing part having a second protruding part and a cleaning member holding part having a second concave part for housing the second protruding part that can be used in the embodiment of the present invention, which are viewed along the rotation axis of the cleaning member assembly;

FIG. 17 is a diagram showing an aspect of a cleaning member holding part having a first protruding part and a housing part having a peripheral edge protruding part and a first concave part for housing the first protruding part that can be used in the embodiment of the present invention, which are viewed along the rotation axis of the cleaning member assembly;

FIG. 18 is a diagram showing an aspect of a housing part having a second protruding part and a cleaning member holding part having a second concave part for housing a peripheral edge protruding part and the second protruding part that can be used in the embodiment of the present invention, which are viewed along the rotation axis of the cleaning member assembly;

FIG. 19A is a diagram showing a third example of an aspect of a cleaning member holding part having a first protruding part and a housing part having a first concave part for housing the first protruding part, which are viewed along the rotation axis of the cleaning member assembly;

FIG. 19B is a side sectional view of the aspect shown in FIG. 19A;

FIG. 20A is a diagram showing a third example of an aspect of a housing part having a second protruding part and a cleaning member holding part having a second concave part for housing the second protruding part that can be used in the embodiment of the present invention, which are viewed along the rotation axis of the cleaning member assembly;

FIG. 20B is a side sectional view of the aspect shown in FIG. 20A;

FIG. 21A is a diagram showing a fourth example of an aspect of a cleaning member holding part having a first protruding part and a housing part having a first concave part for housing the first protruding part, which are viewed along the rotation axis of the cleaning member assembly;

FIG. 21B is a side sectional view of the aspect shown in FIG. 21A;

FIG. 22A is a diagram showing a fourth example of an aspect of a housing part having a second protruding part and a cleaning member holding part having a peripheral edge protruding part and a second concave part for housing the second protruding part, which are viewed along the rotation axis of the cleaning member assembly;

FIG. 22B is a side sectional view of the aspect shown in FIG. 22A;

FIG. 23A is a diagram showing an aspect with a peripheral edge protruding part of uneven thickness that can be used in the embodiment of the present invention, which is viewed along the rotation axis of the cleaning member assembly;

FIG. 23B is a side sectional view of the aspect shown in FIG. 23A;

FIG. 24 is a side sectional view of an aspect in which a mark of a notch or the like is provided in a mounting part of a cleaning member holding part, which can be used in the embodiment of the present invention;

FIG. 25A is a side sectional view of an aspect in which the peripheral edge protruding part that can be used in the embodiment of the present invention has an elastic member, and the elastic member is not in contact with the housing part;

FIG. 25B is a side sectional view of an aspect in which the peripheral edge protruding part that can be used in the embodiment of the present invention has an elastic member, and the elastic member is in contact with the housing part; and FIG. 26 is a block diagram of a substrate processing apparatus according to an embodiment of the present invention.

DETAILED DESCRIPTION

Description of Embodiments

«Configuration»

An embodiment of a substrate processing apparatus including a substrate cleaning apparatus and the like will be described.

As shown in FIG. 1, the substrate processing apparatus, according to the present embodiment, has a roughly rectangular housing 310 and a load port 312; a substrate cassette that stocks a number of substrates W is put on the load port 312. The load port 312 is placed adjacent to the housing 310. The load port 312 can be loaded with an open cassette, a SMIF (Standard Mechanical Interface) pod or a FOUP (Front Opening Unified Pod). A SMIF pod and a FOUP are hermetically sealed enclosure that stores therein a substrate cassette and covers it with a bulkhead, and whereby an environment independent of the external space can be maintained. The substrate W is, for example, a semiconductor wafer and the like.

Inside the housing 310, a plurality of (in an aspect shown in FIG. 1, four) polishing units 314a to 314d, first and second cleaning units 316 and 318 for cleaning a polished substrate W, and a drying unit 320 for drying the cleaned substrate W is contained. The polishing units 314a to 314d are arranged along a long side of the substrate processing apparatus, and the cleaning units 316 and 318 and the drying unit 320 are also arranged along the long side of the substrate processing apparatus. The substrate processing apparatus according to the present embodiment can polish various substrates W in a step of manufacturing a semiconductor wafer with a diameter of 300 mm or 450 mm, a flat panel, an image sensor such as complementary metal oxide semiconductor (CMOS) or charge coupled device (CCD), and a magnetic film in a magnetoresistive random access memory (MRAM). The substrate processing apparatus according to another embodiment may be configured to clean and dry a substrate W without a polishing unit for polishing the substrate W inside the housing 310.

In an area surrounded by the load port 312, and the polishing unit 314a and the drying unit 320 that are located on the side of the load port 312, a first transfer robot 322 is placed. Furthermore, a conveyance unit 324 is placed parallel to the polishing units 314a to 314d as well as the cleaning units 316 and 318 and the drying unit 320. The first transfer robot 322 receives a pre-polished substrate W from the load port 312 and transfers the substrate W to the conveyance unit 324, or receives a dried substrate W, which is taken out from the drying unit 320, from the conveyance unit 324.

A second transfer robot 326 for transferring a substrate W between the first cleaning unit 316 and the second cleaning unit 318 is placed between the first cleaning unit 316 and the second cleaning unit 318, and a third conveyance unit 328 for transferring the substrate W between the second cleaning unit 318 and the drying unit 320 is placed between the second cleaning unit 318 and the drying unit 320. Furthermore, inside the housing 310, a control part 350 for controlling the operation of each device of the substrate processing apparatus is placed. In the present embodiment, there is described the aspect in which the control part 350 is placed inside the housing 310; however, the placement of the control part 350 is not limited to this, and the control part 350 may be placed outside the housing 310, and the control part 350 may be provided at a remote place.

A roll cleaning apparatus for scrubbing a surface of a substrate W while rotating around the center axis parallel with the substrate W by bringing the roll cleaning member 110 linearly extending almost along the full diameter of the substrate W into contact with cleaning liquid may be used for the first cleaning unit 316. A pencil cleaning apparatus for scrubbing a surface of a substrate W by bringing the contact faces of the vertically-extending columnar pencil cleaning members into contact with cleaning liquid and moving the pencil cleaning members in one direction while rotating may be used for the second cleaning unit 318. A spin drying unit for drying a substrate W by injecting IPA steam from a moving injection nozzle toward the horizontally-held and rotating substrate W and drying the substrate W by centrifugal force by faster rotating the substrate W may be used for the drying unit 320.

The first cleaning unit 316 may use not a roll cleaning apparatus, but a pencil cleaning apparatus similar to the second cleaning unit 318 or a two-fluid jet cleaning apparatus for cleaning a surface of a substrate W by two-fluid jet. Further, the second cleaning unit 318 may use not a pencil cleaning apparatus, but a roll cleaning apparatus similar to the first cleaning unit 316, or a two-fluid jet cleaning apparatus for cleaning a surface of a substrate W by two-fluid jet.

The cleaning liquid in the present embodiment contains rinse liquid, such as deionized water (DIW), and chemical liquid, such as ammonia hydrogen peroxide (SC1), hydrochloric acid hydrogen peroxide (SC2), sulfuric acid hydrogen peroxide (SPM), sulfuric acid hydrolysate, or hydrofluoric acid. The cleaning liquid may be a mixed solution or a diluted solution containing these as the main components. In the present embodiment, unless otherwise specified, cleaning liquid means either rinse liquid, chemical liquid or the both rinse liquid and chemical liquid. The cleaning of the present embodiment includes an aspect in which a cleaning member such as the roll cleaning member 110 is rotated and brought into contact with a substrate and a cleaning liquid is supplied to the substrate for scrub cleaning, and an aspect in which a cleaning liquid is simply supplied to a substrate without bringing any member into contact with the substrate.

As shown in FIG. 2, the substrate cleaning apparatus may have a plurality of (four in FIG. 2) spindles (substrate support parts) 40 that horizontally rotates the substrate W while supporting the peripheral edge part of the substrate W such as a semiconductor wafer. These spindles 40 are movable in the horizontal direction as shown by the arrows in FIG. 2. The substrate cleaning apparatus may also have an upper roll arm 42 which is arranged to be movable up and down above the substrate W and a lower roll arm 44 which is arranged to be movable up and down below the substrate W.

The spindles 40 may have rollers 80 at the top, which are substrate support parts. The rollers 80 have fitting grooves 80a formed in the outer side surface. The peripheral edge part of the substrate W is positioned in the fitting grooves 80a, and the rollers 80 are pressed against the substrate W and rotated. As a result, the substrate W is rotated horizontally as shown by an arrow E in FIG. 2. In the embodiment illustrated in the drawing, all the four rollers 80 are connected to a drive mechanism (not shown) to apply a rotational force to the substrate W. Two of the four rollers 80 may apply a rotational force to the substrate W (the drive mechanism is not shown), and the other two rollers 80 may function as bearings that receive the rotation of the substrate W.

The upper roll arm 42 shown in FIG. 2 rotatably supports a horizontally extending columnar roll cleaning member (roll sponge) 110. The roll cleaning member 110 rotates, for example, as shown by an arrow $F_1$ in FIG. 2. The lower roll arm 44 shown in FIG. 2 rotatably supports a horizontally extending columnar roll cleaning member (roll sponge) 110. The roll cleaning member 110 rotates as shown by an arrow $F_2$ in FIG. 2. The upper roll arm 42 may be provided on a horizontally extending support arm 58 with a load cell 54 in between. A tilt mechanism 70 may be placed between the load cell 54 and the free end of the support arm 58 to support the upper roll arm 42 in a tiltable manner. Such a tilt mechanism may also be provided on the lower roll arm 44.

In the embodiment shown in FIG. 2, two upper supply nozzles 50 are arranged above the substrate W that is rotated while being supported by the spindle 40 in order to supply a chemical solution and pure water (rinse solution) onto the front surface (upper surface) of the substrate W. One of the two upper supply nozzles 50 may supply the chemical solution and the other may supply pure water. In addition, two upper supply nozzles 52 may be arranged below the substrate W that is rotated while being supported by the spindle 40 in order to supply a chemical solution and pure water (rinse solution) onto the back surface (lower surface) of the substrate W. One of the two lower supply nozzles 52 may supply the chemical solution and the other may supply pure water.

The spindles 40 are an example of substrate support parts that supports the substrate W, but the substrate support parts may hold the substrate W so as to extend in the horizontal direction, may hold the substrate W so as to extend in the vertical direction, or may hold the substrate W in an inclined manner from the horizontal direction. Unlike the spindles 40 as described above, the substrate support parts may be configured to rotate the substrate W while chucking or attracting and holding the substrate W.

As shown in FIGS. 3 and 4, the substrate cleaning apparatus has: a cleaning member holding part 200 to which a cleaning member assembly 100 having a cleaning member such as a roll cleaning member 110 for cleaning the substrate W is mountable and which is rotatable with the cleaning member assembly 100 mounted; and a member rotation part 180 for rotating the cleaning member assembly 100 held by the cleaning member holding part 200.

The cleaning member assembly 100 may have a cleaning member mounting part 105 and a cleaning member mounted on a surface of the cleaning member mounting part 105. In an example described below, the roll cleaning member 110 is used as the cleaning member. As shown in FIG. 7, the roll cleaning member 110 may be made of a sponge having a plurality of nodules (projection members) 115. The area of the top of each nodule 115 may be 5 $cm^2$ or less. PVDF or PTFE may be used as the material of the cleaning member mounting part 105. Also, as shown in FIG. 8, the roll cleaning member 110 may not have the nodules (projection members) 115.

The cleaning member mounting part 105 shown in FIG. 8 has a pair of protruding parts 105a at an end part which is a mounting part, and a key concave part 105b is formed between the pair of protruding parts 105a. In the aspect shown in FIGS. 8 and 9, the cleaning member assembly 100 is mounted to the cleaning member holding part 200 by fitting a key convex part 205b of the cleaning member holding part 200 into the key concave part 105b. At this time, the protruding part 205a with the key convex part 205b is positioned between the pair of protruding parts 105a. In this way, in the aspect shown in FIGS. 8 and 9, the cleaning member mounting part 105 and the cleaning member holding part 200 have directional characteristics, and both cannot be mounted unless they are in a fixed direction.

In the cleaning member assembly 100, the cleaning member mounting part 105 and the roll cleaning member 110 may be integrally formed, or the roll cleaning member 110 may be formed on the cleaning member mounting part 105. The cleaning member mounting part 105 and the roll cleaning member 110 may be formed as separate members and may be detachable from each other. The roll cleaning member 110 may be made of a polyvinyl alcohol (PVA) sponge material or polyvinyl formal (PVFM) formed by reaction with PVA. The PVA sponge material can be prepared from a homopolymer of polyvinyl acetate or the like. The material of the roll cleaning member 110 may be nylon, polyurethane, or a combination of polyurethane and PVA, or any other moldable material such as other copolymers that do not scratch the substrate W surface but provide material removal suitable for the process.

As shown in FIGS. 3 and 4, the substrate cleaning apparatus may have an inner cleaning liquid supply part 410 that supplies a cleaning liquid into the roll cleaning member 110, and an outer cleaning liquid supply part 420 that supplies the cleaning liquid from the outside of the roll cleaning member 110. The rotation speed of the roll cleaning member 110 is, for example, 50 rotation/minute (rpm) to 400 rpm.

The inner cleaning liquid supply part 410 and the outer cleaning liquid supply part 420 may supply the same cleaning liquid, but the present invention is not limited to this aspect. The inner cleaning liquid supply part 410 and the outer cleaning liquid supply part 420 may supply different cleaning liquids.

In supplying the cleaning liquids of the inner cleaning liquid and the outer cleaning liquid, filters 412 and 422 having a mesh of about 10 nm may be used (see FIGS. 3 and 4). The use of such filters 412 and 422 enables removal of dust contained in the cleaning liquid. The outer cleaning liquid supply part 420 may have an outer cleaning liquid supply member including the nozzles 50, 52 described above, and an outer cleaning liquid storage part 424 which is connected to the outer cleaning liquid supply member to supply the cleaning liquid to the outer cleaning liquid supply member. In this case, the filter 422 may be provided between the outer cleaning liquid storage part 424 and the outer cleaning liquid supply member. In addition, the filter 412 may be provided between the inner cleaning liquid supply part 410 and the cleaning member holding part 200.

As shown in FIGS. 3 and 4, the cleaning member mounting part 105 may have a main body 130, a cleaning liquid introduction part (gap) 135 extending inside the main body 130, and a plurality of cleaning liquid supply holes 140 communicating with the cleaning liquid introduction part 135. The cleaning member mounting part 105 may be formed in a cylindrical shape having a hollow region. This hollow region may constitute the cleaning liquid introduction part 135, and the cleaning liquid supply holes 140 may communicate with the cleaning liquid introduction part 135, so that the cleaning liquid supplied to the cleaning liquid introduction part 135 soaks into the roll cleaning member 110 and may be used to clean the substrate W. FIGS. 3 and 4 show a cross section of the roll cleaning member 110 and the like cut at a place where the nodules 115 are not provided.

The cleaning liquid may be introduced into the cleaning liquid introduction part 135 via a supply pipe 215 provided inside the cleaning member holding part 200.

As shown in FIGS. 5 and 6, the substrate cleaning apparatus has a moving part 150 that moves the cleaning member holding part 200 along the axial direction when the cleaning member assembly 100 is removed, thereby to bring the cleaning member holding part 200 into a rotation fixed position to restrict the rotation of the cleaning member holding part 200. The moving part 150 may be an elastic member 150a such as a spring. The elastic member 150a is housed in the housing part 120, and may be provided at an end part on the side opposite to the side where the roll cleaning member 110 is held (on the left side in FIGS. 5 and 6). If the elastic member 150a is provided, when the cleaning member assembly 100 is removed from the cleaning member holding part 200, the cleaning member holding part 200 is moved along the axial direction under the elastic force from the elastic member 150a. The cleaning member holding part 200 will be placed at the rotation fixed position shown in FIG. 6. However, the present invention is not limited to this aspect, and the moving part 150 may have a driving part (not shown) such as a motor, and the driving part may move the cleaning member holding part 200 along the axial direction.

The cleaning member holding part 200 may have a holding main body part 210 and a peripheral edge protruding part 220 that peripherally protrudes outward from the holding main body part 210. The holding main body part 210 and the peripheral edge protruding part 220 may be integrally configured. The peripheral edge protruding part 220 may peripherally protrudes outward about 2 mm to 5 mm from the holding main body part 210.

FIG. 5 shows a state in which the cleaning member assembly 100 is mounted to the cleaning member holding part 200. In this state, the elastic member 150a is pushed by the cleaning member assembly 100 to the side opposite to the cleaning member assembly 100, and the peripheral edge protruding part 220 is separated from the housing part 120. FIG. 6 shows a state in which the cleaning member assembly 100 is removed from the cleaning member holding part 200. In this state, the cleaning member holding part 200 is pushed by the elastic member 150a, and the peripheral edge protruding part 220 is in contact with the housing part 120.

As shown in FIG. 6, the rotation of the cleaning member holding part 200 may be restricted (fixed) by the peripheral edge protruding part 220 coming into surface contact with the inner surface of the housing part 120 housing at least a part of the cleaning member holding part 200 and being pressed against the inner surface of the housing part 120. If the moving part 150 is made of the elastic member 150a such as a spring, the rotation of the cleaning member holding part 200 is restricted by the peripheral edge protruding part 220 coming into surface contact with the inner surface of the housing part 120 under the elastic force from the elastic member 150a. The peripheral edge protruding part 220 may entirely protrude in the peripheral edge direction with respect to the rotation axis of the roll cleaning member 110 (see FIG. 10), or a plurality of peripheral edge protruding parts 220 may be arranged at intervals (see FIG. 11). Nevertheless, the larger the area of contact with the inner surface of the housing part 120, the easier it is to regulate the rotation of the cleaning member holding part 200. From this viewpoint, it is beneficial that the peripheral edge protruding part 220 entirely protrudes in the peripheral edge direction with respect to the rotation axis of the roll cleaning member 110.

The surface of the peripheral edge protruding part 220 that comes into surface contact with the inner surface of the housing part 120 may be an uneven surface or may be a roughened surface. An elastic member 220a such as rubber may be provided on the surface of the peripheral edge protruding part 220 that comes into surface contact with the inner surface of the housing part 120, so that, when the peripheral edge protruding part 220 is pressed against the inner surface of the housing part 120, the elastic member 220a such as rubber becomes deformed (see FIGS. 25A and 25B). By adopting such an aspect, the value of resistance to the inner surface of the housing part 120 can be increased. If the moving part 150 is made of the elastic member 150a such as a spring, the elastic member 150a does not need to have an extremely high spring constant. The spring constant may be, for example, 0.03 kg/mm to 0.10 kg/mm.

The surface of the peripheral edge protruding part 220 that comes into surface contact with the inner surface of the housing part 120 may be a flat surface. In this case, the force from the moving part 150 can be uniformly transmitted to the inner surface of the housing part 120, thereby generating a frictional force between the entire inner surface of the housing part 120 and the peripheral edge protruding part 220. By adopting such a flat surface, it is possible to prevent unexpected generation of dust and the like when the peripheral edge protruding part 220 comes into contact with the inner surface of the housing part 120.

The cleaning member assembly 100 may have one end held by the cleaning member holding part 200 in a following manner (passively) and the other end driven by the member rotation part 180 with a driving part such as a motor (see FIG. 3). In this case, the cleaning member holding part 200 has a second cleaning member holding part 205b driven by the member rotation part 180 and a first cleaning member holding part 200a driven in the following manner (passively). In this case, the moving part 150 made of the elastic member 150a or the like may be provided in the part driven in the following manner (passive part).

The roll cleaning member 110 does not need to have a double-sided structure, and may have a cantilever structure as shown in FIG. 4. In this case, the member rotation part 180 is provided on the side where the roll cleaning member 110 is held.

In the vertical cross section, the peripheral edge protruding part 220 is thicker on the cleaning member assembly 100 side (right side in FIGS. 5 and 6) than on the side opposite to the roll cleaning member 110 (left side in FIGS. 5 and 6). That is, the height of the peripheral edge protruding part 220 is higher on the cleaning member assembly 100 side (right side in FIGS. 5 and 6) than on the side opposite to the roll cleaning member 110 (left side in FIGS. 5 and 6). In the aspect shown in FIGS. 5 and 6, in the vertical cross section, the thickness of the peripheral edge protruding part 220 increases toward the cleaning member assembly 100 side. However, the present invention is not limited to such an aspect, and the peripheral edge protruding part 220 may become thicker intermittently (for example, in a stepped manner) toward the cleaning member assembly 100 side. Further, as shown in FIGS. 23A and 23B, the peripheral edge protruding part 220 may have a quadrangular cross section and a uniform thickness.

As shown in FIG. 13, the cleaning member holding part 200 has a first protruding part 230 protruding outward from the peripheral edge, and the housing part 120 housing the cleaning member holding part 200 may have a first concave part 190 that houses the first protruding part 230 on the inner surface. In this case, the rotation of the cleaning member holding part 200 is restricted by housing the first protruding part 230 in the first concave part 190. Further, if one or more first protruding parts 230 are provided, a plurality of first concave parts 190 may be provided (see FIG. 14). It is not necessary that the number of the first protruding parts 230 and the number of the first concave parts 190 match but it is only necessary that the number of the first concave parts 190 be larger than the number of the first protruding parts 230. In this case, the rotation of the cleaning member holding part 200 is restricted by housing the first protruding part 230 in any of the first concave parts 190. The first protruding part 230 may have a pin shape, and its length may be about 2 to 5 mm.

Unlike the above-described aspect, as shown in FIG. 15, the housing part 120 housing the cleaning member holding part 200 may have a second protruding part 195 on the inner surface, and the cleaning member holding part 200 may have a second concave part 240 that houses the second protruding part 195. In this case, the rotation of the cleaning member holding part 200 is restricted by housing the second protruding part 195 in the second concave part 240. Further, if one or more second protruding parts 195 are provided, a plurality of second concave parts 240 may be provided (see FIG. 16). It is not necessary that the number of the second protruding parts 195 and the number of the second concave parts 240 match but it is only necessary that the number of the second concave parts 240 be larger than the number of the second protruding parts 195. The second protruding part 195 may have a pin shape, and its length may be about 2 mm to 5 mm.

Moreover, the above-mentioned aspects may be combined. For example, the peripheral edge protruding part 220 and a combination of the first protruding part 230 and the first concave part 190 may be adopted, or both the peripheral edge protruding part 220 and a combination of the second protruding part 195 and the second concave part 240 may be adopted.

In the aspect shown in FIG. 17, the peripheral edge protruding part 220 and a combination of the first protruding part 230 and the first concave part 190 are adopted. In the aspect shown in FIG. 18, the peripheral edge protruding part 220 and a combination of the second protruding part 195 and the second concave part 240 are adopted.

If the peripheral edge protruding part 220 and the combination of the first protruding part 230 and the first concave part 190 is adopted, the aspect shown in FIGS. 19A and 19B may be used. As shown in FIGS. 21A and 21B, a plurality of first protruding parts 230 and a plurality of first concave parts 190 may be adopted.

If the peripheral edge protruding part 220 and the combination of the second protruding part 195 and the second concave part 240 is adopted, the aspect shown in FIGS. 20A and 20B may be used. As shown in FIGS. 22A and 22B, a plurality of second protruding parts 195 and a plurality of second concave parts 240 may be adopted.

As shown in FIGS. 5 and 6, a bearing 260 may have two or more bearing members 261. A lubricating fluid for wetting the bearing 260 may be supplied between the bearing member 261 in the axial direction. This lubricating fluid may consist of a cleaning liquid, particularly a rinse liquid. A sealing part 290 may be provided outside the peripheral edge of an inner member 280. This sealing part may have a first sealing part 291 and a second sealing part 292 adjacent to the first sealing part 291. The first sealing part 291 and the second sealing part 292 may be O-rings.

As shown in FIG. 12, the peripheral edge protruding part 220 may have one or more grooves 220a. The lubricating fluid for wetting the bearing 260 can be allowed to flow through the groove 220a toward the cleaning member assembly 100 side of the housing part 120.

The procedures for mounting the cleaning member assembly 100 to the cleaning member holding part 200 and for removing the cleaning member assembly 100 from the cleaning member holding part 200 will be described with reference to the aspect shown in FIGS. 5, 6, 8 and 9.

To mount the cleaning member assembly 100 to the cleaning member holding part 200, the cleaning member assembly 100 is pushed into the cleaning member holding part 200 on the driven part side so that the elastic member 150a becomes shrunk. In the aspect shown in FIGS. 8 and 9, the protruding part 205a is positioned between the pair of protruding parts 105a, and then the key convex part 205b is fitted into the key concave part 105b to push the cleaning member assembly 100 into the cleaning member holding part 200. In this state, the mounting part 201 of the cleaning member holding part 200 rotates freely, so the cleaning member assembly 100 is rotated to an appropriate position to mount the other end of the cleaning member assembly 100 to the cleaning member holding part 200 on the driving part side (member rotation part 180 side). In the cleaning member holding part 200 on the driving part side as well, the protruding part 205a is positioned between the pair of protruding parts 105a and then the key convex part 205b is fitted into the key concave part 105b.

To remove the cleaning member assembly 100 from the cleaning member holding part 200, the cleaning member assembly 100 is pushed into the cleaning member holding part 200 on the driven part side to shrink the elastic member 150a, and then the other end of the cleaning member assembly 100 is removed from the cleaning member holding part 200 on the driving part side (member rotation part 180 side). After that, one end of the cleaning member assembly 100 is removed from the cleaning member holding part 200 on the driven part side. By removing the cleaning member assembly 100 from the cleaning member holding part 200 in this way, the elastic member 150a brings the peripheral edge protruding part 220 into surface contact with the inner surface of the housing part 120 that houses the cleaning member holding part 200. By pressing the peripheral edge protruding part 220 against the inner surface of the housing part 120 in this way, the rotation of the cleaning member holding part 200 is restricted (fixed).

If the cleaning member assembly 100 has the cleaning member mounting part 105 and the roll cleaning member 110 as separate parts, the roll cleaning member 110 can be replaced by removing mounting members such as nuts for fixing the roll cleaning member 110 to the cleaning member mounting part 105, and then mounting a new roll cleaning member 110 or the cleaned roll cleaning member 110 to the cleaning member mounting part 105.

As shown in FIG. 26, an inner cleaning liquid supply part 410, an outer cleaning liquid supply part 420, the member rotation part 180, the spindles 40 as substrate support parts, an input part 400 for the operator to input information, and the like are connected by wire or wirelessly to the control part 350 that is configured to receive information from them and give commands to them. In FIG. 26, conveyance mechanisms such as the first transfer robot 322, the conveyance unit 324, the second transfer robot 326, and the third transfer robot 328 are collectively shown as a conveyance part 300.

«Advantageous Effects»

Next, advantageous effects of the thus configured present embodiment, which have not yet been described, will be mainly described. Even if it is not described in the Configuration, any configuration described in the Advantageous effects can be adopted in the present invention.

Generally, the cleaning member holding part 200 has the bearing 260 and thus is freely rotatable. Therefore, if the aspect in the present embodiment is not adopted, the part of the cleaning member holding part 200 on the cleaning member assembly 100 side (the right part in FIG. 5) will rotate freely. Since the rotational position of the cleaning member holding part 200 cannot be visually observed at the mounting site, it takes time and effort to mount the cleaning member holding part 200 to the roll cleaning member 110. As an example, in the configuration shown in FIGS. 8 and 9, the cleaning member assembly 100 is mounted to the cleaning member holding part 200 by fitting the key convex part 205b into the key concave part 105b. However, since the mounting part 201 of the cleaning member holding part 200 rotates freely in a state where it cannot be visually observed, it takes time and effort to position the protruding part 205a between the pair of protruding parts 105a. The problem with the time and effort of mounting will be solved if an aspect is adopted in which none of the protruding part 205a and the pair of protruding parts 105a are provided and the cleaning member assembly 100 is mountable to the cleaning member holding part 200 in any direction (has no directional characteristic), unlike the aspect in which the protruding part 205a and the pair of protruding parts 105a are provided as shown in FIGS. 8 and 9. In this case, however, there will arise another problem that the rotative power from the cleaning member holding part 200 cannot be properly transferred to the cleaning member assembly 100.

In the present embodiment, if the moving part 150 is adopted to move the cleaning member holding part 200 along the axial direction with the cleaning member assembly 100 removed and bring the cleaning member holding part 200 into the rotation fixed position where to restrict the rotation of the cleaning member holding part 200, the rotation of the cleaning member holding part 200 can be restricted (fixed) with the cleaning member assembly 100 removed. Therefore, the cleaning member assembly 100 can be easily mounted to the cleaning member holding part 200. In the conventional aspect, since the cleaning member holding part 200 rotates freely as described above, it takes time and effort to mount the cleaning member assembly 100 to the cleaning member holding part 200. According to this aspect, such a problem can be solved. If it takes a long time to mount the cleaning member assembly 100 to the cleaning member holding part 200, the roll cleaning member 110 may become dirty to decrease the degree of cleaning.

When the moving part 150 is made of the elastic member 150a such as a spring, the rotation of the cleaning member holding part 200 can be restricted without introducing a driving part such as a motor. Therefore, the rotation of the cleaning member holding part 200 can be restricted easily and inexpensively.

Since there is no locking mechanism implemented by the member rotation part 180 such as a motor on the driven part side of the cleaning member holding part 200, there occurs a problem that the cleaning member holding part 200 tends to rotate freely. In this regard, the problem can be solved by providing the driven part with the moving part 150 that restricts the rotation of the cleaning member holding part 200. On the other hand, since the rotation of the cleaning member holding part 200 is restricted by the lock mechanism such as a servo lock in the member rotation part 180, the cleaning member holding part 200 will not rotate freely. However, when the lock mechanism such as a servo lock is released, the cleaning member holding part 200 on the driving part side (member rotation part 180 side) will rotate freely. Thus, the moving part 150 may be provided on the driving part side (member rotation part 180 side) to bring the cleaning member holding part 200 into the rotation fixed position.

As shown in FIGS. 10 and 11, if the aspect is adopted in which the cleaning member holding part 200 has the peripheral edge protruding part 220 protruding outward from the peripheral edge and the peripheral edge protruding part 220 comes into surface contact with the inner surface of the housing part 120 housing the cleaning member holding part 200 so that the peripheral edge protruding part 220 is pressed against the inner surface of the housing part 120 to restrict the rotation of the cleaning member holding part 200, the rotation of the cleaning member holding part 200 can be restricted by resistance (sliding resistance) on the surface of the peripheral edge protruding part 220. If the elastic member 150a is supposed to be used as the moving part 150, it is conceivable to use the elastic member 150a having a large spring constant in order to restrict the rotation of the cleaning member holding part 200. However, bringing the peripheral edge protruding part 220 into surface contact with the inner surface of the housing part 120 is advantageous in restricting the rotation of the cleaning member holding part 200 without having to use the elastic member 150a with an extremely large spring constant.

As shown in FIG. 12, if the aspect is adopted in which the peripheral edge protruding part 220 has one or more grooves 220a, it is possible to guide the lubricating fluid supplied to the bearing 260 via the groove(s) 220a toward the cleaning member assembly 100 side. Therefore, even if dust or the like adheres to the surface of the peripheral edge protruding part 220 on the cleaning member assembly 100 side, it can be washed away with the lubricating fluid. When the cleaning member assembly 100 is attached and the substrate W is cleaned, the peripheral edge protruding part 220 is separated from the housing part 120 and rotates freely, so that the surface of the peripheral edge protruding part 220 on the cleaning member assembly 100 side can be easily cleaned by the lubricating fluid.

As shown in FIGS. 5 and 6, if the aspect is adopted in which the peripheral edge protruding part 220 is thicker on the cleaning member assembly 100 side than the side opposite to the roll cleaning member 110 in the vertical cross section, the lubricating fluid supplied from a lubricating fluid supply pipe 121 easily passes over the peripheral edge protruding part 220 and is guided to the cleaning member assembly 100 side. Therefore, as described above, even if dust or the like adheres to the surface of the peripheral edge protruding part 220 on the cleaning member assembly 100 side, it can be washed away with the lubricating fluid. In addition, if this aspect is adopted, the peripheral edge protruding part 220 can be made thicker on the rotation axis side (root) to increase the strength.

As shown in FIGS. 13 and 14, if the aspect is adopted in which the cleaning member holding part 200 has the first protruding part 230 protruding outward from the peripheral edge, and the housing part 120 housing the cleaning member holding part 200 has the first concave part 190 housing the first protruding part 230 in the inner surface, the rotation of the cleaning member holding part 200 can be restricted by housing the first protruding part 230 in the first concave part 190. In this case, it is possible to more reliably prevent the end part (mounting part) of the cleaning member holding part 200 on the cleaning member assembly 100 side from rotating. However, in this aspect, since the first protruding part 230 needs to be housed in the first concave part 190, the advantage is inferior to the aspect in which the peripheral edge protruding part 220 protrudes from the peripheral edge of the holding main body part 210. In order to house the first protruding part 230 in the first concave part 190, rotating the end part (mounting part 201) of the cleaning member holding part 200 on the cleaning member assembly 100 side allows the first protruding part 230 to fit automatically into the first concave part 190.

If a plurality of first concave parts 190 is provided, the number of first concave parts 190 capable of housing the first protruding parts 230 can be increased, so that the first protruding parts 230 can be easily housed in the first concave parts 190 at removal of the cleaning member assembly 100. If one first protruding part 230 and one first concave part 190 are provided, when the cleaning member assembly 100 is removed, the cleaning member holding part 200 can always be positioned at the same position. Therefore, if the structure as shown in FIGS. 8 and 9 is adopted, when the cleaning member assembly 100 is removed, the protruding part 205a can be positioned at substantially the same position between the pair of protruding parts 105a.

As shown in FIGS. 15 and 16, if the aspect is adopted in which the housing part 120 housing the cleaning member holding part 200 has the second protruding part 195 on the inner surface, and the cleaning member holding part 200 houses the second concave part 240 housing the second protruding part 195, the rotation of the cleaning member holding part 200 can be restricted by housing the second protruding part 195 in the second concave part 240. However, in this embodiment as well, the second protruding part 195 needs to be housed in the second concave part 240. Thus, the advantage of this aspect is inferior in that it is necessary to check the positions of the second protruding part 195 and the second concave part 240 at the removal of the cleaning member assembly 100, to the aspect in which the peripheral edge protruding part 220 protrudes from the peripheral edge of the holding main body part 210. If one second concave part 240 and one second protruding part 195 are provided, when the cleaning member assembly 100 is removed, the cleaning member holding part 200 can always be positioned at the same position as in the aspect described above. Therefore, if the structure as shown in FIGS. 8 and 9 is adopted, when the cleaning member assembly 100 is removed, the protruding part 205a can be positioned at substantially the same position between the pair of protruding parts 105a.

In the aspect in which the peripheral edge protruding part 220 is adopted, a mark 270 such as a notch may be provided in the mounting part 201 of the cleaning member holding part 200 as shown in FIG. 24. The mark 270 may be provided at only one place, or may be provided as a pair positioned at 180 degrees from each other. By providing the mark 270, the mounting part 201 of the cleaning member holding part 200 placeable at any position in the rotation direction can be placed at a predetermined position where the mounting part 201 is easy to place in the positional relationship to the cleaning member holding part 200 on the driving part side (member rotation part 180 side).

If a plurality of second concave parts 240 is provided, the number of second concave parts 240 capable of housing the second protruding parts 195 can be increased, so that the second protruding parts 195 can be easily housed in the second concave parts 240 at removal of the cleaning member assembly 100.

From the viewpoint of ease of manufacture, the combination of the first protruding part 230 and the first concave part 190 is superior to the combination of the second protruding part 195 and the second concave part 240.

In one embodiment, the processing object to be cleaned by the cleaning member is not limited to a semiconductor wafer, but may be a silicon wafer, a glass substrate, a printed wiring board, a liquid crystal panel, or a solar panel. Further, the shape of the plane of the processing object may be circular or rectangular, and the thickness of the plane may be a thickness that allows in-plane deflection. The substrate to be processed includes a square substrate and a circular substrate. Further, the rectangular substrate includes a glass substrate, a liquid crystal substrate, a printed circuit board, with a polygonal shape such as a rectangle, and other polygonal plating objects. The circular substrate includes a semiconductor wafer, a glass substrate, and other circular plating objects.

As the cleaning liquid, high-temperature pure water, ammonium hydrogen-peroxide mixture (APM), sulfuric-acid hydrogen peroxide mixture (SPM), carbonated water, ultrasonic water, ozone water and others are applicable.

The above description of the embodiments and the disclosure of the drawings are merely examples for describing the invention defined in the claims, and the invention defined in the claims is not limited by the above description of the embodiments and the disclosure of the drawings. In addition, the description of the claims at the time of filing is only an example, and the description of the claims can be changed as appropriate based on the description of the description, drawings, and the like.

REFERENCE SIGNS LIST

40 Spindle (substrate support part)
100 Cleaning member assembly
120 Housing part
150 Moving part
180 Member rotation part
190 First concave part
195 Second protruding part
200 Cleaning member holding part
220 Peripheral edge protruding part
220a Groove
230 First protruding part
240 Second concave part
W Substrate

The invention claimed is:
1. A cleaning member mounting mechanism comprising:
a cleaning member holding part, to which a cleaning member assembly having a cleaning member for cleaning a substrate can be mounted;

a member rotation part for rotating the cleaning member assembly held by the cleaning member holding part; and a moving part which moves the cleaning member holding part along an axial direction when the cleaning member assembly is removed, thereby to bring the cleaning member holding part into a rotation fixed position to restrict a rotation of the cleaning member holding part, wherein the cleaning member holding part has a peripheral edge protruding part which protrudes peripherally outward, and the rotation of the cleaning member holding part is restricted by the peripheral edge protruding part coming into surface contact with an inner surface of a housing part.

2. The cleaning member mounting mechanism according to claim 1, wherein the moving part is an elastic member.

3. The cleaning member mounting mechanism according to claim 1, wherein the cleaning member holding part has a second cleaning member holding part provided on a member rotation part side and rotated by the member rotation part, and a first cleaning member holding part rotated passively, and the moving part is provided in the first cleaning member holding part.

4. The cleaning member mounting mechanism according to claim 1, wherein the peripheral edge protruding part has one or more grooves.

5. The cleaning member mounting mechanism according to claim 1, wherein in a vertical cross section, the peripheral edge protruding part is thicker on a cleaning member side than on a side opposite to the cleaning member side.

6. The cleaning member mounting mechanism according to claim 1, wherein the housing part housing at least a part of the cleaning member holding part has a first concave part housing the protruding part on the inner surface of the housing part, or the housing part housing at least the part of the cleaning member holding part has a second protruding part on the inner surface of the housing part, and the cleaning member holding part has a second concave part which houses the second protruding part.

7. The cleaning member mounting mechanism according to claim 6, wherein a plurality of the first concave parts are provided when the first protruding part is provided, or a plurality of the second concave parts are provided when the second protruding part is provided.

8. A substrate cleaning apparatus comprising: a substrate support part for supporting a substrate; a cleaning member holding part, to which a cleaning member assembly having a cleaning member for cleaning the substrate can be mounted; a member rotation part for rotating the cleaning member assembly held by the cleaning member holding part; and a moving part which moves the cleaning member holding part along an axial direction when the cleaning member assembly is removed, thereby to bring the cleaning member holding part into a rotation fixed position to restrict a rotation of the cleaning member holding part, wherein the cleaning member holding part has a peripheral edge protruding part which protrudes peripherally outward, and the rotation of the cleaning member holding part is restricted by the peripheral edge protruding part coming into surface contact with an inner surface of the housing part.

* * * * *